United States Patent [19]

Shimizu et al.

[11] Patent Number: 4,651,322
[45] Date of Patent: Mar. 17, 1987

[54] SEMICONDUCTOR LASER

[75] Inventors: Hirokazu Shimizu, Toyonaka; Kunio Itoh, Uji; Takashi Sugino; Masaru Wada, both of Takatsuki; Iwao Teramoto, Ibaraki; Kazuo Fujimoto, Takatsuki, all of Japan

[73] Assignee: Matsushita Electric Industrial Co., Ltd., Kadoma, Japan

[21] Appl. No.: 754,195

[22] Filed: Jul. 10, 1985

Related U.S. Application Data

[63] Continuation of Ser. No. 397,873, Jul. 13, 1982, abandoned.

[30] Foreign Application Priority Data

Jul. 17, 1981 [JP] Japan .................................. 56-112489

[51] Int. Cl.⁴ .............................................. H01S 3/19
[52] U.S. Cl. ........................................ 372/45; 372/46; 372/49
[58] Field of Search ...................... 372/44, 45, 49, 29, 372/33, 46, 48

[56] References Cited

U.S. PATENT DOCUMENTS 3,838,359  9/1974  Hakki et al. ............................ 372/49

Primary Examiner—James W. Davie
Attorney, Agent, or Firm—Cushman, Darby & Cushman

[57] ABSTRACT

In a laser of such type that the distribution of the effective refractive index varies in a direction which is along the face of its active layer and perpendicular to the direction of the laser light transmission, thereby defining the active region to be between a pair of refractive index changing zones, the refractive indexes of a pair of end surfaces of a laser resonator (i.e. the active region) is made smaller than the intrinsic refractive indexes of the cleavage face of the active layer.

9 Claims, 11 Drawing Figures

SEMICONDUCTOR LASER

This is a continuation of application Ser. No. 397,873, filed July 13, 1982, which was abandoned upon the filing hereof.

BACKGROUND OF THE INVENTION

1. Field of the Invention

The present invention relates to a semiconductor laser.

2. Description of the Prior Art

A semiconductor laser has distinct advantages such as smallness in bulk, high efficiency and direct modulation by means of its current, and therefore has a bright future as a light source for optical communication, optical data processing or the like. Lasers, of such use, necessitate having the characteristic of stable fundamental transverse mode lasing; and especially fluctuation of light intensity (noise) is an important problem when the laser is used for transmission of information by for instance modulating the laser light.

The conventional continuous wave (CW) lasing semiconductor laser has double heterostructure (DH structure), and cleaved faces are used as the end faces of its cavity. On the other hand, as a waveguide to provide guiding in the junction plane, a gain guide or refractive index guide has been used.

FIG. 1 is a sectional front view showing an exemplary configuration of the conventional planar stripe type semiconductor laser of the gain guide type, and FIG. 2 is a sectional front view showing an exemplary configuration of the conventional channelled substrate type semiconductor laser of the refractive index guide type.

In the above two conventional examples, the parts designated by the numerals 1 to 8 are as follows:

| | |
|---|---|
| 1 Substrate | n-GaAs, |
| 2 a first clad layer | n-Ga$_{1-y}$Al$_y$As, |
| 3 an active layer | undoped Ga$_{1-x}$Al$_x$As, |
| 4 a second clad layer | p-Ga$_{1-y}$Al$_y$As, |
| 5 an isolation layer | n-GaAs, |
| 6 a positive side electrode, | |
| 7 a negative side electrode, and | |
| 8 a stripe shaped current injection region. | Zn-diffused region |

It is known that when the above-mentioned conventional semiconductor laser is operated to oscillate under a predetermined constant light output power, noise characteristics peculiar to the configurations are observed.

FIG. 3 is graph showing such noise characteristics, wherein the abscissa is graduated with ambient temperature and the ordinate is graduated with S/N ratios of 3 mW output and noise which is measured with the center frequency of 3 MHz and band width of 300 KHz. The curve I shows the characteristic of the planar stripe laser of FIG. 1 and the curve II shows that of the channelled substrate type laser of FIG. 2. As shown by FIG. 3, the gain guide type lasers such as the planar stripe type lasers have generally higher noise levels than the channelled substrate type lasers. This is because in the gain guide type lasers, there is no built-in distribution of refractive index to stabilize the transverse mode, and the distributions of the electromagnetic fields and of carriers are not temporally and spatially stable. Therefore, the noise becomes high as a result of the interaction of above-mentioned two factors. However, in the gain guide type lasers the longitudinal mode becomes a multiple longitudinal mode, and therefore, noise formed by competition of respective longitudinal modes is small. Accordingly, even when the gain spectrum change takes place as a result of temperature change, the noise level flicker due to the mode competition is small. On the other hand, in the refractive index guide type lasers, such as channelled substrate lasers, the noise level is lower in the stabilized noise range in comparison with that of the gain guide type laser, since the transverse mode thereof is stabilized. But, in general in the transverse-mode stabilized laser, the oscillation mode is of a single longitudinal mode. Accordingly, when the gain spectrum distribution changes responding to temperature change, the longitudinal mode jumps and the neighboring two longitudinal modes create the mode-competition between each other, and produce a high noise. Therefore, the refractive index guide laser generally has ranges of high noise which appear as a result of temperature changes. Therefore, if the conventional semiconductor lasers are used for a light source for playing back a video disk, due to their high noise characteristics, i.e. low S/N ratio, their uses are not practical.

SUMMARY OF THE INVENTION

The present invention proposes to provide an improved semiconductor laser capable of oscillating at a stable continuous wave with low noise. The present invention is useful in improving noise characteristics of the semiconductor laser of the refractive index guide type.

A semiconductor laser in accordance with the present invention comprises:

a semiconductor substrate plural semiconductor layers including an active layer, which are provided on the semiconductor substrate, the active layer comprising a cavity defined by a pair of end faces, light reflective indexes of parts of said pair of end faces being selected to be smaller than the light reflective index of the cleaved faces of the active layer.

DESCRIPTION OF THE PREFERRED EMBODIMENTS

In the present invention, the noise of the laser is lowered by selecting the light reflectivities of parts of a pair of end faces of a cavity resonator in the active layer to be smaller than that of the cleaved face of the active layer.

Such an end face can be formed either by chemically etching the end face or by forming a film thereon.

In the semiconductor device, wherein reflectivities of the end faces of the cavity resonator are made to be smaller than those of the intrinsic cleaved faces of the active region, transmission loss at the cavity end face(s) of the lowered reflectivity(ies) becomes large. Therefore, the gain required for laser oscillation becomes larger, and carrier density and gain spectrum width increases, and thereby, the oscillation mode becomes almost a multiple longitudinal mode, and as a result, the competition noise becomes low. Furthermore, with regards to the internal structure, the transverse mode is stabilized by means of the refractive index guide, and accordingly noise induced by the unstable transverse mode is small. Thus, the noise characteristic makes small changes.

Figure 1:
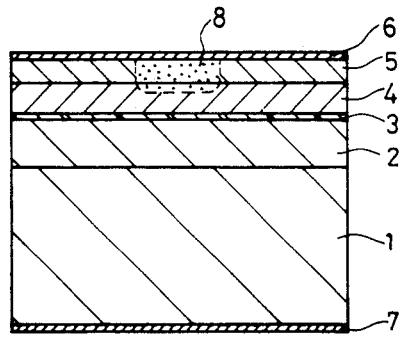
FIG. 1 is a sectional front view of an exemplary conventional laser of the gain waveguide type.
Figure 2:
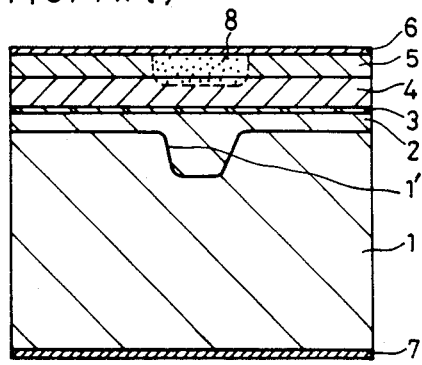
FIG. 2 is a sectional front view of an exemplary conventional laser of the refractive index guide type.
Figure 3:
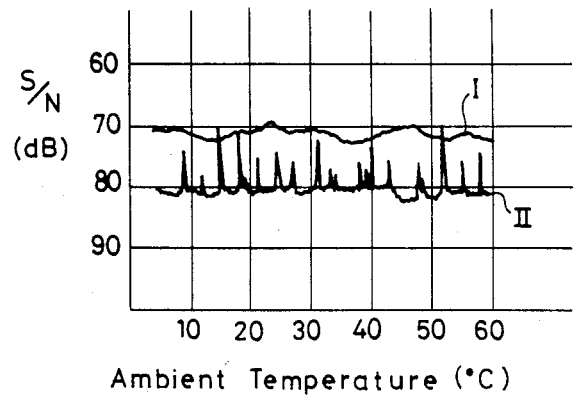
FIG. 3 is a graph showing S/N ratio characteristics of the semiconductor lasers of FIG. 1 (curve I) and FIG. 2 (curve II).
Figure 4:
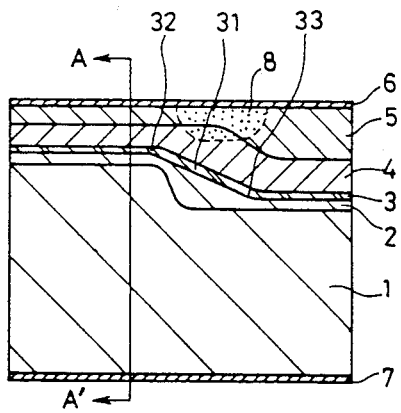
FIG. 4 is a sectional front view of an exemplary semiconductor laser of the refractive index guide type.
Figure 5:
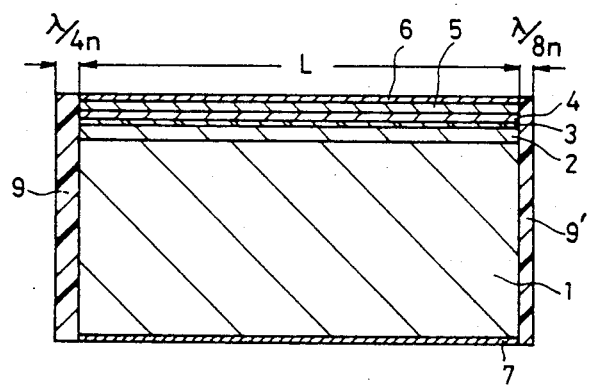
FIG. 5 is a sectional side view of the laser of FIG. 4.

FIG. 4 shows an example of a semiconductor laser of the refractive index guide type seen from the direction of the transmission of the oscillated light. FIG. 5 is a sectional side view seen from the direction perpendicular to the transmission of the oscillated light. The sectional configuration of the laser is of the known terraced substrate type semiconductor laser, as disclosed in FIG. 11 of the U.S. Pat. No. 4,392,227 filed on Jan. 13, 1981.

That is, the embodiment of FIG. 4 has:

| | |
|---|---|
| a terrace-shaped substrate 1 of and thereon epitaxial layers of | n-GaAs, |
| a first clad layer 2 of | n-Ga$_{1-y}$Al$_y$As, |
| an active layer 3 having an oblique lasing region 31 of | (undoped) Ga$_{1-x}$Al$_x$As, |
| a second clad layer 4 of | p-Ga$_{1-y}$Al$_y$As, |
| a cap layer 5 of | n-GaAs, and |
| a current injection region 8 of | Zn-diffused region, where $0 \leq x \leq y \leq 1$. |

Thereon, a positive side electrode 6 and a negative side electrode 7 are formed on the upper face and the bottom face of the above-mentioned wafer.

The diffused region 8 is disposed in a stripeshaped pattern at such position and to such depth that its one corner part reaches into the second clad layer 4 at the part above the oblique lasing region 31 of the active layer 3, and its other corner lies in the lower part of the cap layer 5. In the terraced substrate laser of FIG. 4, the active layer 3 has a thicker part 31 which serves as the active region. This active region 31 is defined by a pair of bending parts 32 and 33, from which parts to the outside parts are thinner. The thickness of the first clad layer 2 makes a more drastic change in that, under the oblique part or the active region 31 of the active layer 3, the first clad layer 2 is thick while at the parts other than that part, the first clad layer is thin. By means of the above-mentioned configuration, the active region 31 constitutes a rib waveguide, and the refractive index guide for a transverse mode is formed, and the transverse mode is stabilized. Therefore, there is substantially no noise based on instability of the transverse mode. This example has a feature on the end face of the cavity resonator. As usual, the wafer is cleaved to form a pair of cleaved mirror faces as the end faces of the cavity. The construction around the end faces is elucidated referring to FIG. 5 which is a sectional side view of the device of FIG. 4. The distance between the cleaved faces of the example i.e. the cavity length L is 0.02 cm as shown in FIG. 5. Then, as shown in FIG. 5, on the front end face and rear end face are formed in SiO$_2$ film 9 of $\lambda/4\eta$ thickness and an SiO$_2$ film 9' of $\lambda/8\eta$ thickness, respectively, by sputtering or electron beam evaporation. Therein, $\lambda$ is the wavelength of the oscillated light and $\eta$ is the refractive index of the SiO$_2$ film 9 for the wavelength of $\lambda$. By such selection of the thickness, the reflectivities R$_1$ and R$_2$ at the end face 9 and the end face 9' for the internal light of the cavity was 3% and 16%, respectively. These reflectivities are smaller than the intrinsic reflectivity of the cleaved end faces of the Ga$_{1-x}$Al$_x$As active layer 3. And the transmission loss at the front end of the cavity 9 (which is given by a formula of $(\frac{1}{2}L)\ln(1/R_1 \cdot R_2)$) was about 134 cm$^{-1}$. The temperature dependency characteristic of the noise level at 3 mW continuous light output of a semiconductor laser for oscillating 780 nm light is shown in FIG. 6.

Figure 6:
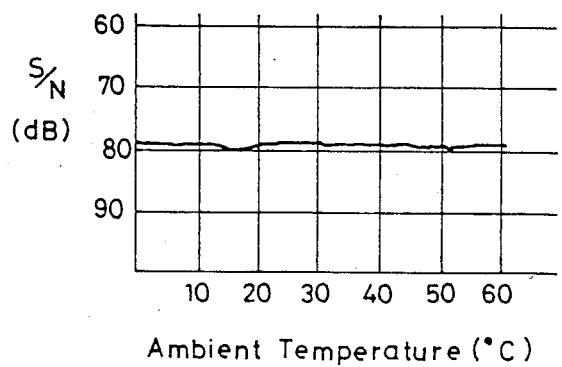
FIG. 6 is a graph showing S/N ratio vs. ambient temperature characteristic of the laser of FIGS. 4 and 5.

As shown in FIG. 6, the noise level of the semiconductor laser of this example embodying the present invention is stabilized for a wide temperature range to a low value, hardly showing noticeable fluctuation with respect to temperature change. The characteristic is thus satisfactory.

Figure 7:
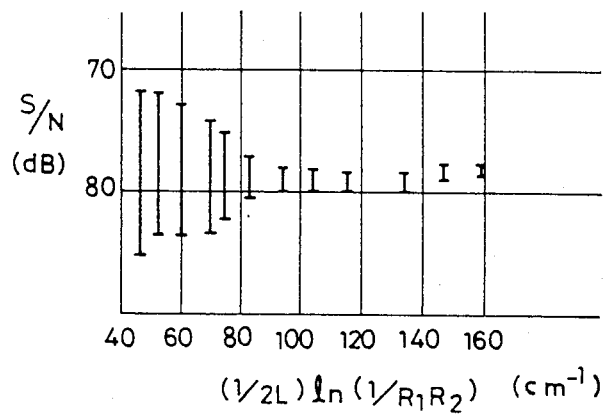
FIG. 7 is a graph showing S/N ratio vs. transmission loss at cavity end faces of the laser of FIGS. 4 and 5.

FIG. 7 shows measured data of the S/N ratio (light output/noise ratio) for several samples of the terraced substrate type (GaAl)As lasers of FIG. 4 with cavity lengths L of 0.02 cm, 0.025 cm and 0.03 cm, wherein SiO$_2$ films of various thicknesses are formed on the cleaved end faces thereof by sputtering, thereby obtaining various transmission losses at the cavity end faces. In FIG. 7, the ordinate is graduated by fluctuation range of S/N ratios for temperature variations between 0° C. to 60° C. The noise at 3 mW continuous wave light oscillation was measured as 3 MHz frequency and 300 KHz band width. When the transmission loss exceeds 90 cm$^{-1}$, the S/N ratio becomes a considerably large value and the fluctuation becomes small. Thus, by appropriately lowering the reflectivity of the end face of the cavity in the direction of laser light transmission, a semiconductor laser of practically low noise can be made.

Figure 8:
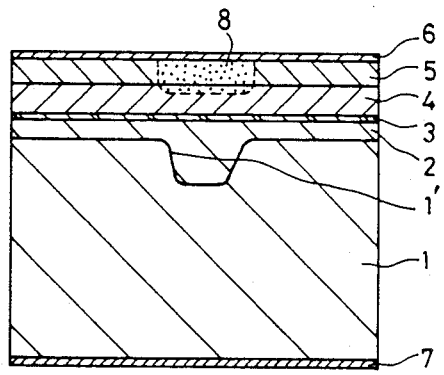
FIG. 8 is a sectional front view of another exemplary semiconductor laser of the refractive index guide type.
Figure 9:
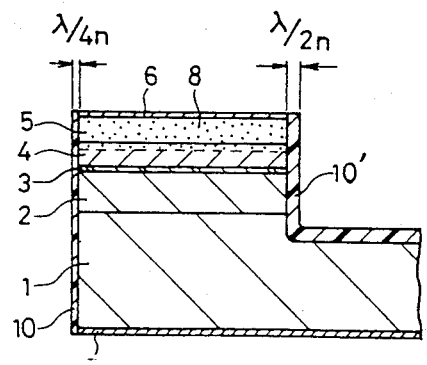
FIG. 9 is a sectional side view of the laser of FIG. 8.

FIG. 8 and FIG. 9 show a second example laser of refractive index guide construction embodying the present invention. FIG. 8 is the sectional front view seen from the direction of the transmission of the oscillated light. FIG. 9 is the sectional side view seen from the direction perpendicular to the direction of the light transmission.

The semiconductor laser shown by FIGS. 8 and 9 has:

| | |
|---|---|
| a substrate 1 with stripe shaped groove of and thereon epitaxial layers of | n-GaAs, |
| a first clad layer 2 of | n-Ga$_{1-y}$Al$_y$As, |
| an active layer 3 of | (undoped) Ga$_{1-x}$Al$_x$As, |
| a second clad layer 4 of | p-Ga$_{1-y}$Al$_y$As, |
| a cap layer 5 of | n-GaAs, and |
| a stripe-shaped current injection region 8 of | Zn-diffused region, where $0 \leq x < y \leq 1$. |

A positive side electrode 6 and a negative side electrode 7 are formed on the upper face and the bottom face of the above-mentioned wafer.

The diffused region 8 is disposed in a stripe shaped pattern at such position as above the groove 1' and to such depth that its diffusion front penetrates the cap layer 5 and reaches into the second clad layer 4. In the device of FIGS. 8 and 9, the first clad layer changes its thickness, that is, it is thicker above the groove 1' and thinner above the other parts. Therefore, the active layer 3 has a distribution of its refractive index changing along its lateral direction (which is the direction perpendicular to the direction of oscillated laser light transmission). On one end face of the wafer, hence on one end face of the active layer 3, $Al_2O_3$ films 10 are formed. The other end face 10' is then chemically etched to make a roughened face, by means of etchant prepared by mixing aqueous solutions of NaOH, $H_2O_2$ and $NH_4OH$, and thereafter a film of $Al_2O_3$ is formed thereon, with thickness of $\lambda/(2\eta)$ as shown in the sectional side view of FIG. 9. The thickness of the front $Al_2O_3$ film 10 is $\lambda/(4\eta)$ and the thickness of the rear $Al_2O_3$ film 10' is $\lambda/(2\eta)$, where $\lambda$ is the wavelength of the oscillated light and $\eta$ is the refractive index of the $Al_2O_3$ film for the wavelength of $\lambda$. The reflectivity of the film 10' is slightly smaller than that of the cleaved end faces, and the reflective index of the end face 10 is much smaller than that of the cleaved faces.

Figure 10:
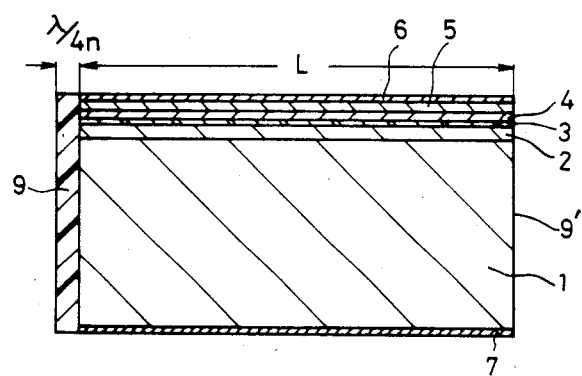
Figure 11:
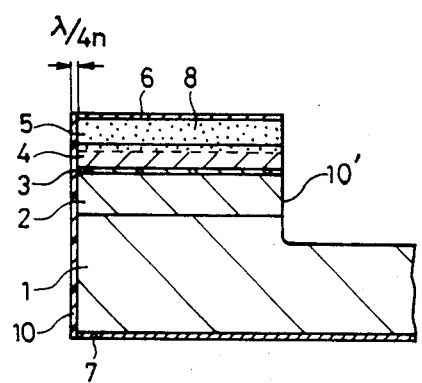

FIG. 10 and FIG. 11 show other examples. In each of these examples one end face of the active layer is covered by $SiO_2$ film, but the other end face 9 or 10' is only chemically etched and left uncovered. In this case also, the etched end face has a smaller reflection index than that of the cleaved end faces.

As other examples, in the same configurations as FIGS. 4, 5, 8, 9, 10 and 11, the film(s) to cover the end face(s) of the active layer is made by BeO formed by, for instance, electron beam evaporation.

As has been elucidated on the embodiments, the reflectivity of both end faces of the the active layer formed by the above described process and in the above described configuration, become smaller than that of the cleaved face of the active layer. In this laser, the S/N ratio at the continuous wave oscillation is improved by 5 to 10 db in comparison with the laser of the same sectional front view configuration but having end faces of the active layer formed by the simple cleaving of the wafer.

What is claimed is:

1. A semiconductor laser comprising:
a semiconductor substrate,
plural semiconductor layers including an active layer, which are provided on said semiconductor substrate, and a pair of end faces defining a resonant cavity,
a pair of electrodes to supply current to said active layer,
characterized in that
said active layer has a variation in its effective refractive index along a direction which is parallel to said end faces and parallel to faces of said active layer, and
light reflectivity of each of said end faces is selected to be smaller than the light reflectivity when said plural semiconductor layers are cleaved for reducing light intensity fluctuation noise.

2. A semiconductor laser comprising:
a semiconductor substrate,
plural semiconductor layers including an active layer, which are provided on said semiconductor substrate,
a pair of end faces defining a resonant cavity,
said active layer comprising an active region defined by said pair of end faces, said active layer having a variation in its effective refractive index along a direction which is parallel to said end faces and parallel to faces of said active layer, and
each of said end faces comprising a film thereby to make light reflectivity of this end face smaller than the light reflectivity when said plural semiconductor layers are cleaved for reducing light intensity fluctuation noise.

3. A semiconductor laser comprising:
a semiconductor substrate,
plural semiconductor layers including an active layer, which are provided on said semiconductor substrate,
a pair of end faces defining a resonant cavity,
said active layer comprising an active region defined by said pair of end faces, said active layer having a variation in its effective refractive index along a direction which is parallel to said end faces and parallel to faces of said active layer, and
each of said end faces is a chemically etched surface thereby to make light reflectivity of each chemically etched end face smaller than the light reflectivity when said plural semiconductor layers are cleaved for reducing light intensity fluctuation noise.

4. A semiconductor laser comprising:
a semiconductor substrate,
plural semiconductor layers including an active layer, which are provided on said semiconductor substrate,
a pair of end faces defining a resonant cavity,
said active layer comprising an active region defined by said pair of end faces, said active layer having a variation in its effective refractive index along a direction which is parallel to said end faces and parallel to faces of said active layer, and
one of said end faces is a chemically etched surface and the other one of said end faces comprises a film thereby to make light reflectivity of each end face to be smaller than the light reflectivity when said plural semiconductor layers are cleaved for reducing light intensity fluctuation noise.

5. A semiconductor laser in accordance with claim 2 or 4, wherein said film is of $SiO_2$.

6. A semiconductor laser in accordance with claim 2 or 4, wherein said film is of BeO.

7. A semiconductor laser in accordance with claim 2 or 4, wherein said film is of $Al_2O_3$.

8. A semiconductor laser comprising:
a semiconductor substrate,
plural semiconductor layers including an active layer, which are provided on said semiconductor substrate,
a pair of end faces defining a resonant cavity,
said active layer comprising an active region defined by said pair of end faces, said active layer having a variation in its effective refractive index along a direction which is perpendicular to a direction of laser light and parallel to end faces of said active layer, and
light reflectivity of each of said end faces being selected to be smaller than the light reflectivity when said plural semiconductor layers are cleaved for reducing light intensity fluctuation noise.

9. A semiconductor laser according to claim 1, 2, 3, 4, or 8, wherein a transmission loss of said laser $1/(2L)\ln(1/R_1R_2)$ is greater than 90 cm$^{-1}$, where L is a length of said cavity, and $R_1$ and $R_2$ are reflectivities of said end faces, respectively.

* * * * *